United States Patent
Zhang

(10) Patent No.: US 12,277,895 B2
(45) Date of Patent: Apr. 15, 2025

(54) GATE DRIVE CIRCUITS AND DISPLAY PANELS

(71) Applicant: WUHAN CHINA STAR OPTOELECTRONICS SEMICONDUCTOR DISPLAY TECHNOLOGY CO., LTD., Hubei (CN)

(72) Inventor: Huanxi Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/260,016

(22) PCT Filed: Apr. 21, 2023

(86) PCT No.: PCT/CN2023/089847
§ 371 (c)(1),
(2) Date: Jun. 29, 2023

(87) PCT Pub. No.: WO2024/178820
PCT Pub. Date: Sep. 6, 2024

(65) Prior Publication Data
US 2024/0420621 A1 Dec. 19, 2024

(30) Foreign Application Priority Data
Mar. 1, 2023 (CN) .......................... 202310191137.9

(51) Int. Cl.
G09G 3/32 (2016.01)
(52) U.S. Cl.
CPC ....... *G09G 3/32* (2013.01); *G09G 2300/0819* (2013.01); *G09G 2300/0852* (2013.01);
(Continued)

(58) Field of Classification Search
CPC ... G09G 2310/0267; G09G 2300/0819; G09G 2310/0286; G09G 2310/08
See application file for complete search history.

(56) References Cited

U.S. PATENT DOCUMENTS

2011/0148853 A1* 6/2011 Ko ........................ G09G 3/3677
345/213
2016/0343336 A1* 11/2016 Dai ....................... G09G 3/3677
(Continued)

FOREIGN PATENT DOCUMENTS

CN 109064982 A 12/2018
CN 109416903 A 3/2019
(Continued)

OTHER PUBLICATIONS

International Search Report in International application No. PCT/CN2023/089847, mailed on Nov. 23, 2023.
(Continued)

*Primary Examiner* — Kevin M Nguyen
(74) *Attorney, Agent, or Firm* — PV IP PC; Wei Te Chung

(57) ABSTRACT

The present application discloses a gate drive circuit and a display panel. The gate drive circuit includes a plurality of cascaded gate drive units. Each of the gate drive units includes a stage transmission signal selection circuit, a pull-up control circuit, a pulse number reduction circuit, a first inversion circuit, a first output stage and a second output stage, and can output a second gate control signal with a greater number of pulses and a first gate control signal with a less number of pulses.

20 Claims, 10 Drawing Sheets

(52) U.S. Cl.
CPC ............. *G09G 2300/0861* (2013.01); *G09G 2310/0267* (2013.01); *G09G 2310/0286* (2013.01); *G09G 2310/08* (2013.01); *G09G 2320/02* (2013.01)

(56) References Cited

U.S. PATENT DOCUMENTS

2017/0256221 A1  9/2017  Li
2020/0273417 A1  8/2020  Zhao et al.

FOREIGN PATENT DOCUMENTS

| CN | 111223452 A | 6/2020 |
| CN | 112802422 A | 5/2021 |
| CN | 113096578 A | 7/2021 |
| CN | 113794469 A | 12/2021 |
| KR | 20150100516 A | 9/2015 |
| KR | 20210043773 A | 4/2021 |

OTHER PUBLICATIONS

Written Opinion of the International Search Authority in International application No. PCT/CN2023/089847, mailed on Nov. 23, 2023.
Korean Office Action issued in corresponding Korean Patent Application No. 10-2023-7039479 dated Jul. 28, 2024, pp. 1-5.

* cited by examiner

GATE DRIVE CIRCUITS AND DISPLAY PANELS

TECHNICAL FIELD

The present application relates to the field of manufacturing display panels, and more particularly to gate drive circuits and display panels.

BACKGROUND

With continuous update of a pixel circuit, a gate drive circuit also needs to be improved to provide various gate control signals required by the pixel circuit.

However, in the conventional gate drive circuit, pulses of various gate control signals that can be provided by a gate drive unit are limited in terms of time, number, or the like, and cannot meet the requirement of driving a corresponding pixel circuit.

SUMMARY

The present application provides a gate drive circuit and a display panel, so as to alleviate such technical problem that the pulses of various gate control signals that can be provided by the same gate drive unit cannot meet the requirement of the pixel circuit in terms of time, number, or the like.

In a first aspect, the present application provides a gate drive circuit including a plurality of cascaded gate drive units, wherein each of the gate drive units includes: a stage transmission signal selection circuit electrically connected between a first wiring and a first node; a pull-up control circuit for controlling a potential of a second node according to a potential of the first node and a potential of a first clock signal; a pulse number reduction circuit electrically connected between the second node and a third node and including a control terminal electrically connected to a reset line; a first inversion circuit connected between the second node and a fourth node; a first output stage for outputting a first gate control signal according to a potential of the third node and a potential of the fourth node; and a second output stage for outputting a second gate control signal according to a potential of the second node, where a number of pulses of the second gate control signal in a frame is greater than a number of pulses of the first gate control signal in the frame.

In some implementations, the pulse quantity reduction module includes a first transistor, where one of a source or a drain of the first transistor is electrically connected to the second node, another one of the source or the drain of the first transistor is electrically connected to the third node, and a gate of the first transistor is electrically connected to the reset line.

In some implementation, a ratio of a channel width of the first transistor to a channel length of the first transistor is greater than or equal to 0.5 and less than or equal to 1.5.

In some implementations, the pulse quantity reduction module further includes a first capacitor, where one terminal of the first capacitor is electrically connected to the gate of the first transistor, and another terminal of the first capacitor is electrically connected to the another one of the source or the drain of the first transistor.

In some embodiments, the first output stage includes: a pull-up transistor, where a gate of the pull-up transistor is electrically connected to the third node, one of a source or a drain of the pull-up transistor is electrically connected to a second clock line, and another one of the source or the drain of the pull-up transistor outputs a first gate control signal; and a second capacitor, where one terminal of the second capacitor is electrically connected to a gate of the pull-up transistor, and another terminal of the second capacitor is electrically connected to the another one of the source or the drain of the pull-up transistor; wherein a ratio of a capacity of the first capacitor to a capacity of the second capacitor is greater than or equal to 0.5.

In some embodiments, the stage transmission signal selection module includes: a second transistor, where one of a source or a drain of the second transistor is electrically connected to a low potential line, another one of the source or the drain of the second transistor is electrically connected to the first node, a first gate of the second transistor is electrically connected to the first wiring and a second gate of the second transistor, and the second transistor is an N-channel type thin film transistor; and a third transistor, where one of a source or a drain of the third transistor is electrically connected to a high potential line, another one of the source or the drain of the third transistor is electrically connected to the first node, a gate of the third transistor is electrically connected to the first gate of the second transistor, and the third transistor is a P-channel type thin film transistor.

In some embodiments, an output terminal of the second output stage is electrically connected to a second gate control line for transmitting a second gate control signal having a first positive pulse and a second positive pulse in sequence in a frame; and an output terminal of the first output stage is electrically connected to a first gate control line for transmitting a first gate control signal having a first negative pulse in a frame.

In some embodiments, in a frame, a duration of the second positive pulse is longer than a duration of the first negative pulse, and the duration of the first negative pulse falls within the duration of the second positive pulse.

In some embodiments, a control terminal of the pull-up control module is electrically connected to a first clock line for transmitting the first clock signal; the first output stage is electrically connected to a second clock line for transmitting a second clock signal, a phase difference between the first clock signal and the second clock signal being 180°; and a falling edge of the second clock signal, a falling edge of the second positive pulse, and a rising edge of the first negative pulse each fall within a duration of a positive pulse of the first clock signal.

In a second aspect, the present application provides a display panel, including a pixel circuit including a writing transistor for controlling inputting of a data signal and a compensation transistor for controlling inputting of the data signal to a gate of a drive transistor; and the gate drive circuit in at least one of the embodiments described above, where the output terminal of the first output stage is electrically connected to a gate of the writing transistor, and the output terminal of the second output stage is electrically connected to a gate of the compensation transistor.

In some embodiments, the first gate control signal is an Nth stage of negative pulse scanning signal, and the second gate control signal is the Nth stage of positive pulse scanning signal; and the control terminal of the pulse number reduction module is connected to a (N–X)-th positive pulse scanning signal, where N is an integer greater than or equal to 1 and X is an integer greater than or equal to 2.

In some embodiments, the pixel circuit further includes a first initialization transistor for initializing a potential of the gate of the driving transistor, where a gate of the first initialization transistor is connected to a (N–X)-th positive pulse scanning signal.

In some embodiments, the stage transmission signal selection module is connected to a start control signal or an (N−Y)-th positive pulse scanning signal, where Y is an integer greater than or equal to 1.

Beneficial Effects

According to the gate drive circuit and the display panel provided in the present application, the second gate control signal with a greater number of pulses can be output through the stage transmission signal selection module, the pull-up control module, and the second output stage, while the second gate control signal can also be selected as a stage transmission signal among different gate drive units. Moreover, the first gate control signal with a less number of pulses can be output by the stage transmission signal selection module, the pull-up control module, the pulse quantity reduction module, the first inversing module, and the first output stage, which can satisfy the need of the corresponding pixel circuit for the pulses of the gate control signal in the frame in terms of time, quality, or the like, thereby enabling the pixel circuit to be driven to realize picture quality display.

DETAILED DESCRIPTION

To make the objectives, technical solutions, and effects of the present application more clear and definite, the present application is illustrated in detail below by referring to the accompanying drawings and illustrating the embodiments. It should be understood that the specific implementations described here are only used to explain the present application, and are not used to limit the present application.

In addition, the term "first" and "second" are for illustrative purposes only and are not to be construed as indicating or imposing a relative importance or implicitly indicating the number of technical features indicated, such that features defined by "first" and "second" may explicitly or implicitly include one or more of the recited features. In the description of the present application, the meaning of "plurality" is two or more, unless otherwise specifically defined.

Figure 1:
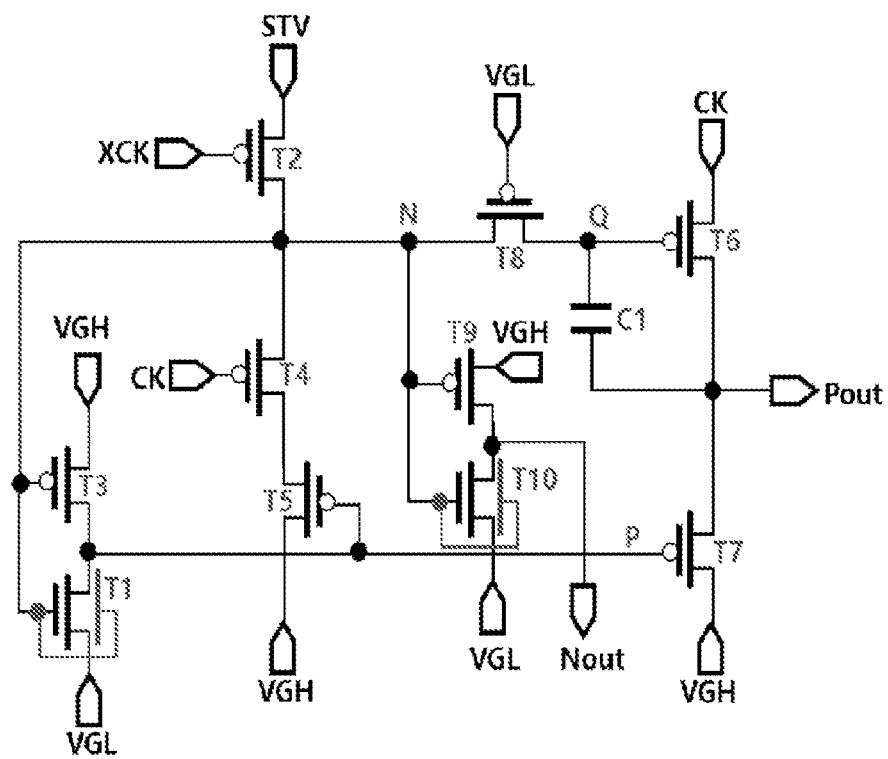
FIG. 1 is a schematic structural diagram of a gate drive circuit in the related art.
Figure 2:
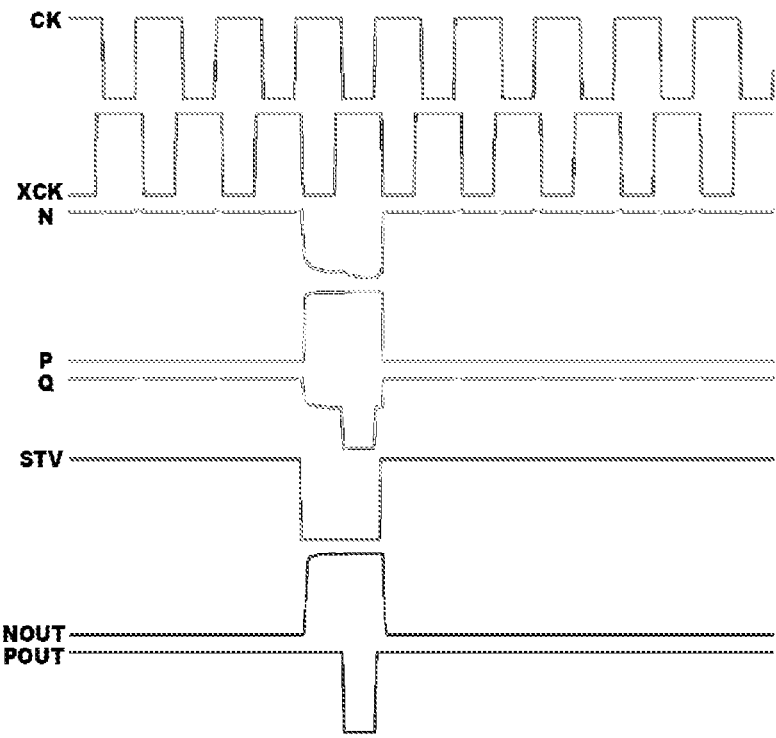
FIG. 2 is a schematic timing diagram of the gate drive circuit shown in FIG. 1.

Referring to FIGS. 1 and 2, where FIG. 1 is a schematic structural diagram of a gate drive circuit in the related art. FIG. 2 is a schematic timing diagram of the gate drive circuit shown in FIG. 1. Although such a gate drive circuit can simultaneously output a gate control signal (Nout) having a positive pulse and a gate control signal (Pout) having a negative pulse, the gate drive circuit has a disadvantage that only one positive pulse of the gate control signal (Nout) and only one negative pulse of the gate control signal (Pout) can be output in one frame at the same time, which cannot satisfy the requirement of driving a corresponding pixel circuit.

Figure 3:
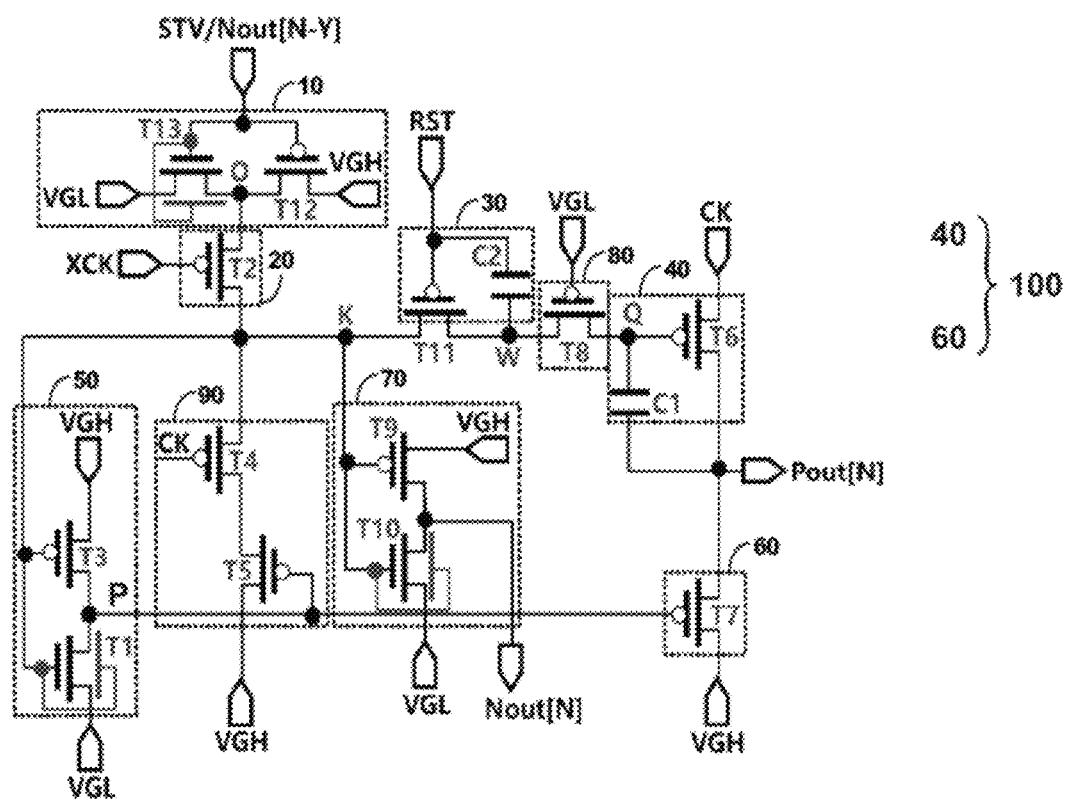
FIG. 3 is a schematic structural view of a gate drive circuit according to an embodiment of the present application.

In view of this, an embodiment of the present application provides a gate drive circuit, as shown in FIGS. 1-19. The gate drive circuit includes a plurality of cascaded gate drive units, one of which includes at least a stage transmission signal selection circuit 10, a pull-up control circuit 20, a pulse number reduction circuit 30, a first inversion circuit 50, a first output stage 100, and a second output stage 70, as shown in FIG. 3.

The stage transmission signal selection circuit 10 may be electrically connected between a first wiring and a first node O.

The pull-up control circuit 20 may control the potential of a second node K according to the potential of the first node O and the potential of a first clock signal.

The pulse number reduction circuit 30 may be electrically connected between the second node K and a third node Q and have a control terminal electrically connected to a reset line.

The first inversion circuit 50 may be connected between the second node K and a fourth node P.

The first output stage 100 may output a first gate control signal according to the potential of the third node Q and the potential of the fourth node P.

The second output stage 70 may output a second gate control signal according to the potential of the second node K, where a number of pulses of the second gate control signal in a frame is greater than a number of pulses of the first gate control signal in the frame.

It should be understood that, according to the gate drive circuit provided in the embodiment of the present application, the second gate control signal with a greater number of pulses can be output through the stage transmission signal selection circuit 10, the pull-up control circuit 20, and the second output stage 70, while the second gate control signal can also be selected as a stage transmission signal among different gate drive units. Moreover, the first gate control signal with a less number of pulses can be output by the stage transmission signal selection circuit 10, the pull-up control circuit 20, the pulse number reduction circuit 30, the first inversing circuit 50, and the first output stage 100, which can satisfy the need of the corresponding pixel circuit for the pulses of the gate control signal in the frame in terms of time, quality, or the like, thereby enabling the pixel circuit to be driven to realize picture quality display.

The stage transmission signal selection circuit 10 may have an input terminal electrically connected to a start control signal or an (N–Y)-th stage of positive pulse scanning signal, where N is an integer greater than or equal to 1, and Y is an integer greater than or equal to 1.

The pull-up control circuit 20 may have an input terminal electrically connected to an output terminal of the stage transmission signal selection circuit 10 and a control terminal electrically connected to a first clock line.

The pulse number reduction circuit 30 may have an input terminal electrically connected to an output terminal of the pull-up control circuit 20 and a control terminal electrically connected to a reset line.

A pull-up circuit 40 may have a control terminal electrically connected to an output terminal of the pulse number reduction circuit 30, an input terminal electrically connected to a second clock line, and an output terminal electrically connected to an Nth stage of negative pulse scanning line. The first inversion circuit 50 may have an input terminal electrically connected to the output terminal of the pull-up control circuit 20.

A pull-down circuit 60 may have a control terminal electrically connected to an output terminal of the first inversion circuit 50, an input terminal electrically connected to a high potential line, and an output terminal electrically connected to the Nth stage of negative pulse scanning line.

The second output stage 70 may have an input terminal electrically connected to the input terminal of the pull-up control circuit 20 and an output terminal electrically connected to an Nth stage of positive pulse scanning line, where the number of positive pulses output by the Nth stage of positive pulse scanning line in a frame is greater than the number of negative pulses output by an Nth stage of negative pulse scanning line in the frame.

In one embodiment, the first output stage 100 includes the pull-up circuit 40 and the pull-down circuit 60.

It should be noted that the first wiring may be the start control line or the (N–Y)-th stage of positive pulse scanning line, where, when (N–Y) is less than or equal to 0, the first wiring is the start control line. The Nth stage of positive pulse scanning line, i.e., the second gate control line, may be used to transmit an Nth stage of positive pulse scanning signal Nout[N], i.e., the second gate control signal. The Nth stage of negative pulse scanning line, i.e., the first gate control line, may be used to transmit an Nth stage of negative pulse scanning signal Pout[N], i.e., the first gate control signal.

In an embodiment, the pulse number reduction circuit 30 includes a first transistor T11, where one of a source or a drain of the first transistor T11 is electrically connected to the output terminal of the pull-up control circuit 20, another one of the source or the drain of the first transistor T11 is electrically connected to the control terminal of the pull-up circuit 40, and a gate of the first transistor T11 is electrically connected to the reset line; where the first transistor T11 is a P-channel type thin film transistor, the reset line is a (N–X)-th stage of positive pulse scanning line, and X is an integer greater than or equal to 2.

It should be noted that the output terminal of the pull-up control circuit 20 may be the second node K. The control terminal of the pull-up circuit 40 may be the third node Q. The another one of the source or the drain of the first transistor T11 is a node W. The pulse number reduction circuit 30 is configured for reducing double pulses occurring in a frame at the second node K to a single pulse occurring in the frame at the third node Q. Specifically, the first pulse occurring in a frame at the second node K is eliminated, while the second pulse occurring in the frame is retained.

In an embodiment, a ratio of a width of a channel of the first transistor T11 to a length of the channel of the first transistor T11 may be greater than or equal to 0.5 and less than or equal to 1.5.

It should be noted that the embodiment of the present application advantageously ensures the output stability of the Nth-stage of negative pulse scanning signal Pout[N], which avoids a phenomenon of coupling pull-down occurring before the negative pulse.

In an embodiment, the pulse number reduction circuit 30 further includes a first capacitor C2, where one terminal of the first capacitor C2 is electrically connected to the gate of the first transistor T11, and another terminal of the first capacitor C2 is electrically connected to the another one of the source or the drain of the first transistor T11.

It should be noted that the embodiment of the present application advantageously further improves the output stability of the Nth stage of negative pulse scanning signal Pout[N].

In an embodiment, the pull-up circuit 40 includes: a pull-up transistor T6, where a gate of the pull-up transistor T6 is electrically connected to the one of the source or the drain of the first transistor T11, one of a source or a drain of the pull-up transistor T6 is electrically connected to the second clock line, and another one of the source or the drain of the pull-up transistor T6 is electrically connected to the Nth stage of negative pulse scanning line; and a second capacitor C1, where one terminal of the second capacitor C1 is electrically connected to the gate of the pull-up transistor T6, and another terminal of the second capacitor C1 is electrically connected to the another one of the source or the drain of the pull-up transistor T6; where a ratio of a capacity of the first capacitor C2 to a capacity of the second capacitor C1 is greater than or equal to 0.5.

It should be noted in the embodiment of the present application that the ratio of the capacity of the first capacitor C2 to the capacity of the second capacitor C1 is designed to further advantageously ensure the output stability of the Nth-stage of negative pulse scanning signal Pout[N], which avoids a phenomenon of coupling pull-down occurring before the negative pulse.

Specifically, the capacity of the first capacitor C2 may be greater than or equal to 50 fF. The capacity of the second capacitor C1 may be greater than or equal to 100 fF.

A ratio of a width of a channel of the pull-up transistor T6 to a length of the channel of the pull-up transistor T6 may be greater than 30:1, thereby further ensuring the output stability of the Nth stage of negative pulse scanning signal Pout[N]. The pull-up transistor T6 may be a P-channel type thin film transistor.

In an embodiment, the stage transmission signal selection circuit 10 includes: a second transistor T13, where one of a source or a drain of the second transistor T13 is electrically connected to a low potential line, another one of the source or the drain of the second transistor T13 is electrically connected to the input terminal of the pull-up control circuit 20, a first gate of the second transistor T13 is electrically connected to the start control line or the (N–Y) th stage of positive pulse scanning line, and the first gate of the second transistor T13 is electrically connected to a second gate of the second transistor T13, and the second transistor T13 is an N-channel type thin film transistor; and a third transistor T12, where one of a source or a drain of the third transistor T12 is electrically connected to a high potential line, another one of the source or the drain of the third transistor T12 is electrically connected to the another one of the source or the drain of the second transistor T13, a gate of the third transistor T12 is electrically connected to the first gate of the second transistor T13, and the third transistor T12 is a P-channel type thin film transistor.

It should be noted that the stage transmission signal selection circuit 10 of the embodiment of the present application not only objectively has an inverting effect, that is, the input signal and the output signal of the transmission selection circuit 10 have opposite potentials at the same time, but also functions to make the Nth-stage of positive pulse scanning signal Nout[N] as the stage transmission signal between the gate drive units. Otherwise, the stage transmission between the gate drive units cannot be realized, which causes the gate drive circuit to fail to normally supply the corresponding scanning signal.

A ratio of a width of a channel of the second transistor T13 to a length of the channel of the second transistor T13 may be greater than or equal to 2:1. A ratio of a width of a channel of the third transistor T12 to a length of the channel of the third transistor T12 may be in the range of 0.5:1~3:1.

The high potential line is used to transmit a high potential signal VGH that can control the N-channel type thin film transistor to be turned on or the P-channel type thin film transistor to be turned off. The low potential line is used to transmit a low potential signal VGL that can control the P-channel type thin film transistor to be turned on or the N-channel type thin film transistor to be turned off.

In an embodiment, the pull-up control circuit 20 includes a pull-up control transistor T2, where one of a source or a drain of the pull-up control transistor T2 is electrically connected to the output terminal of the stage transmission signal selection circuit 10, another one of the source or the drain of the pull-up control transistor T2 is electrically connected to the input terminal of the pulse number reduction circuit 30, and a gate of the pull-up control transistor T2 is electrically connected to the first clock line.

It should be noted that the pull-up control transistor T2 may be a P-channel type thin film transistor. A ratio of a width of a channel of the pull-up control transistor T2 to a length of the channel of the pull-up control transistor T2 may be in the range of 0.5:1~3:1.

In an embodiment, the first inversion circuit 50 includes: a transistor T3 and a transistor T1, where one of a source or a drain of the transistor T3 is electrically connected to the high potential line, another one of the source or the drain of the transistor T3 is electrically connected to one of a source or a drain of the transistor T1 and the control terminal of the pull-down circuit 60, another one of the source or the drain of the transistor T1 is electrically connected to the low potential line, and the output terminal of the pull-up control circuit 20 is electrically connected to a gate of the transistor T3, a first gate of the transistor T1, and a second gate of the transistor T1.

It should be noted that the transistor T3 may be a P-channel type thin film transistor. The transistor T1 may be a double-gate N-channel type thin film transistor. In this way, the dynamic performance of the transistor T3 and the transistor T1 can be improved, and thus the dynamic performance of the first inversion circuit 50 can be improved.

A ratio of a width of a channel of the transistor T3 to a length of the channel of the transistor T3 may be in the range of 0.5:1~3:1. A ratio of a width of a channel of the transistor T1 to a channel length of the transistor T1 may be greater than or equal to 2:1.

In an embodiment, the pull-down circuit 60 includes a pull-down transistor T7, where one of a source or a drain of the pull-down transistor T7 is electrically connected to the high potential line, another one of the source or drain of the pull-down transistor T7 is electrically connected to the Nth stage of negative pulse scanning line, and a gate of the pull-down transistor T7 is electrically connected to the output terminal of the first inversion circuit 50, i.e., the fourth node P.

It should be noted that the pull-down film transistor T7 may be a P-channel type thin film transistor. The Nth stage of negative pulse scanning signal Pout[N] can be modulated by the combination of the pull-down circuit 60 and the pull-up circuit 40 to obtain a desired Nth stage of negative pulse scanning signal Pout[N].

A ratio of a width of a channel of the pull-down transistor T7 to a length of the channel of the pull-down transistor T7 may be greater than or equal to 30:1.

In an embodiment, the second output stage 70 includes: a transistor T9 and a transistor T10, where one of a source or a drain of the transistor T9 is electrically connected to the high potential line, another one of the source or the drain of the transistor T9 is electrically connected to one of a source or a drain of the transistor T10 and the N-th stage of positive pulse scanning line, another one of the source or the drain of the transistor T10 is electrically connected to the low potential line, and the output terminal of the pull-up control circuit 20 is electrically connected to a gate of the transistor T9, a first gate of the transistor T10, and a second gate of the transistor T10.

It should be noted that the transistor T9 may be a P-channel type thin film transistor. The transistor T10 may be a double-gate N-channel type thin film transistor. In this way, the dynamic performance of the transistor T9 and the transistor T10 can be improved, and thus the dynamic performance of the second output stage 70 can be improved.

A ratio of a width of a channel of the transistor T9 to a length of the channel of the transistor T9 may be greater than or equal to 30:1. A ratio of a width of a channel of the transistor T10 to a length of the channel of the transistor T10 may be greater than or equal to 30:1.

In an embodiment, the N-th stage of gate drive unit further includes a leakage prevention circuit 80, where an input terminal of the leakage prevention circuit 80 is electrically connected to the output terminal of the pulse number reduction circuit 30, and an output terminal of the leakage prevention circuit 80 is electrically connected to the control terminal of the pull-up circuit 40, and a control terminal of the leakage prevention circuit 80 is electrically connected to the low potential line.

It should be noted that the leakage prevention circuit 80 may be used to prevent a charge of the third node Q from flowing towards the node W, thereby facilitating the potential stability of the third node Q.

In an embodiment, the leakage prevention circuit 80 includes a leakage prevention transistor T8, where one of a source or a drain of the leakage prevention transistor T8 is electrically connected to the output terminal of the pulse number reduction circuit 30, another one of the source or the drain of the leakage prevention transistor T8 is electrically connected to the control terminal of the pull-up circuit 40, and a gate of the leakage prevention transistor T8 is electrically connected to the low potential line.

It should be noted that the leakage prevention transistor T8 may be a P-channel type thin film transistors or an N-channel type thin film transistor. In this case that the leakage prevention transistor T8 is the N-channel type thin film transistor, the gate of the leakage prevention transistor T8 needs to be electrically connected to the high potential line.

A ratio of a width of a channel of the leakage prevention transistor T8 to a length of the channel of the leakage prevention transistor T8 may be in the range of 0.5:1~3:1.

In an embodiment, the Nth stage of gate drive unit further includes a feedback circuit 90 including a transistor T4 and a transistor T5, where one of a source or a drain of the transistor T4 is electrically connected to the output terminal of the pull-up control circuit 20, a gate of the transistor T4 is electrically connected to the second clock line, another one of the source or drain of the transistor T4 is electrically connected to one of a source or a drain of the transistor T5, another one of the source or the drain of the transistor T5 is electrically connected to the high potential line, and a gate of the transistor T5 is electrically connected to the output terminal of the first inversion circuit 50.

A ratio of a width of a channel of the transistor T4 to a length of the channel of the transistor T4 may be in the range of 0.5:1~3:1. A ratio of a width of a channel of the transistor T5 to a length of the channel of the transistor T5 may be in the range of 0.5:1~3:1.

It should be noted that the feedback circuit 90 can maintain the second node K at a high potential according to the potential of the fourth node P and the potential of the second clock line. That is, in the case where the fourth node P is at a low potential and the second clock signal CK is at a low potential, the high potential line can control the potential of the second node K to be the potential of a high potential signal VGH.

It should be noted that the Nth stage of positive pulse scanning line may be configured to transmit an Nth stage of positive pulse scanning signal Nout[N]. The Nth stage of negative pulse scanning line may be used to transmit an Nth stage of negative pulse scanning signal Pout[N]. The first clock line may be used to transmit the first clock signal XCK. The second clock line may be used to transmit the second clock signal CK. The start control line may be used to transmit the start control signal STV. The (N−Y)-th stage of positive pulse scanning line may be used to transmit the (N−Y)-th stage of positive pulse scanning signal Nout[N−Y]. The (N−X)-th stage of positive pulse scanning line may be used to transmit the (N−X)-th stage of positive pulse scanning signal Nout[N−X]. The reset line may be used to transmit the reset signal RST.

Figure 4:
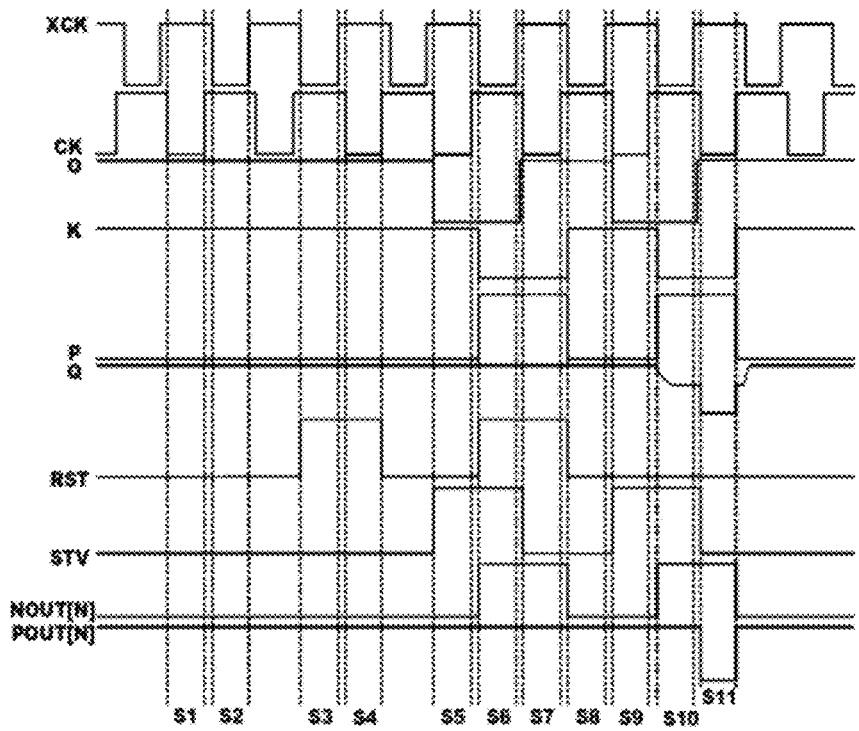
FIG. 4 is a schematic timing diagram of the gate drive circuit shown in FIG. 3.

An operation process of the gate drive unit in a frame may include following phases as shown in FIG. 4.

Figures 5, 6:
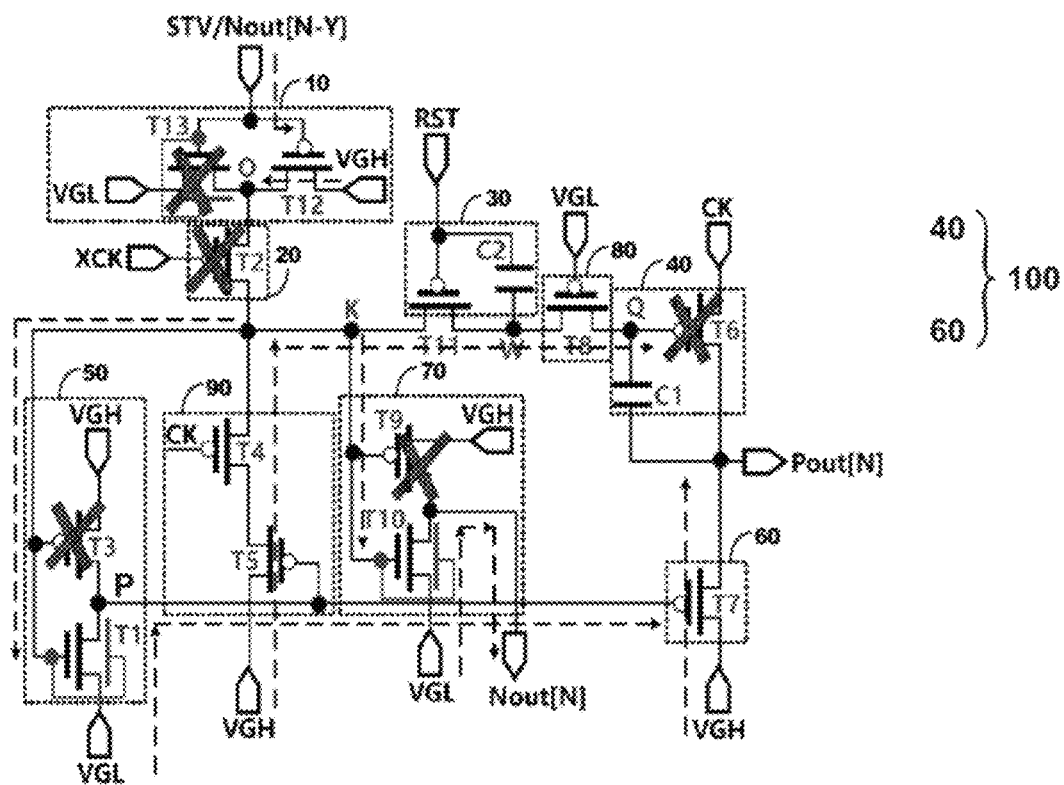
FIG. 5 is a schematic diagram of a state of the gate drive circuit shown in FIG. 3 in a first phase in FIG. 4.
FIG. 6 is a schematic diagram of a state of the gate drive circuit shown in FIG. 3 in a second phase in FIG. 4.

In a first phase S1: as shown in FIGS. 4 and 5, the start control signal STV, the reset signal RST, and the second clock signal CK are all at a low potential, the first clock signal XCK is at a high potential, the first node O, the second node K, and the third node Q are all at a high potential, the fourth node P is at a low potential, the Nth stage of positive pulse scanning signal Nout[N] is at a low potential, and the Nth stage of negative pulse scanning signal Pout[N] is at a high potential.

In a second phase S2: as shown in FIGS. 4 and 6, the start control signal STV, the reset signal RST, and the first clock signal XCK are all at a low potential, the second clock signal CK is at a high potential, the first node O, the second node K, and the third node Q are all at a high potential, the fourth node P is at a low potential, the Nth stage of positive pulse scanning signal Nout[N] is at a low potential, and the Nth stage of negative pulse scanning signal Pout[N] is at a high potential.

Figure 7:
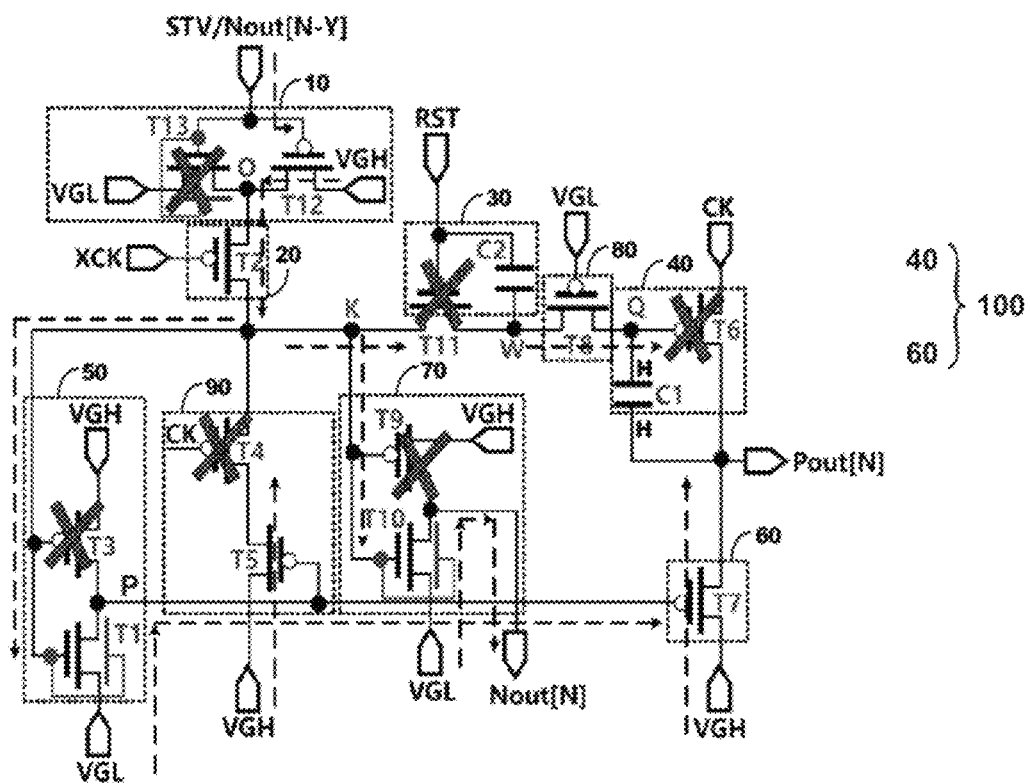
FIG. 7 is a schematic diagram of a state of the gate drive circuit shown in FIG. 3 in a third phase in FIG. 4.

In a third phase S3: as shown in FIGS. 4 and 7, the start control signal STV and the first clock signal XCK are both at a low potential, the reset signal RST and the first clock signal CK are both at a high potential, the first node O, the second node K, and the third node Q are all at a high potential, the fourth node P is at a low potential, the Nth stage of positive pulse scanning signal Nout[N] is at a low potential, and the Nth stage of negative pulse scanning signal Pout[N] is at a high potential.

Figure 8:
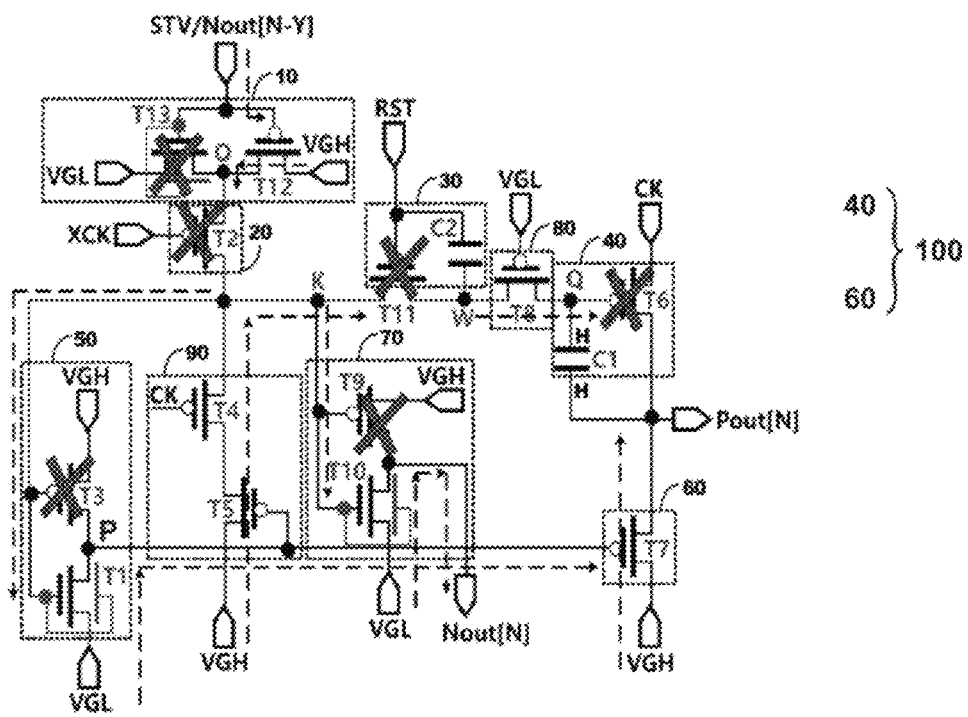
FIG. 8 is a schematic diagram of a state of the gate drive circuit shown in FIG. 3 in a fourth phase in FIG. 4.

In a fourth phase S4: as shown in FIGS. 4 and 8, the start control signal STV and the second clock signal CK are both at a low potential, the reset signal RST and the first clock signal XCK are both at a high potential, the first node O, the second node K, and the third node Q are all at a high potential, the fourth node P is at a low potential, the Nth stage of positive pulse scanning signal Nout[N] is at a low potential, and the Nth stage of negative pulse scanning signal Pout[N] is at a high potential.

Figure 9:
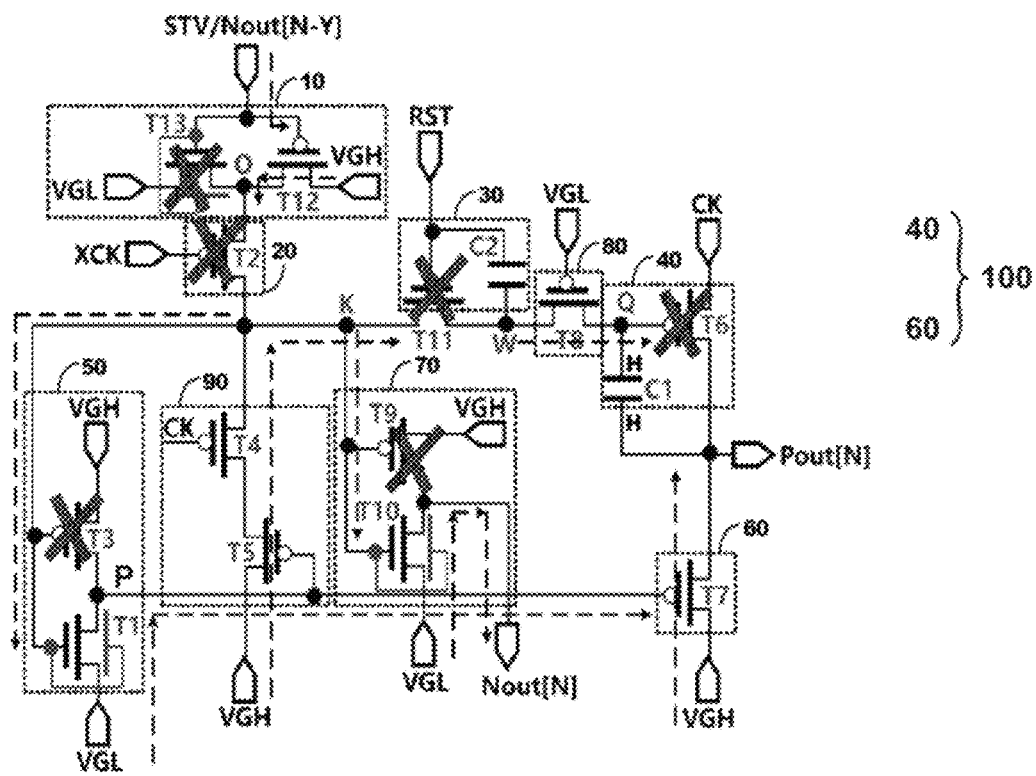
FIG. 9 is a schematic diagram of a state of the gate drive circuit shown in FIG. 3 in a fifth phase in FIG. 4.

In a fifth phase S5: as shown in FIGS. 4 and 9, the reset signal RST and the second clock signal CK are both at a low potential, the start control signal STV and the first clock signal XCK are both at a high potential, the second node K and the third node Q are both at a high potential, the first node O and the fourth node P are both at a low potential, the Nth stage of positive pulse scanning signal Nout[N] is at a low potential, and the Nth stage of negative pulse scanning signal Pout[N] is at a high potential.

Figure 10:
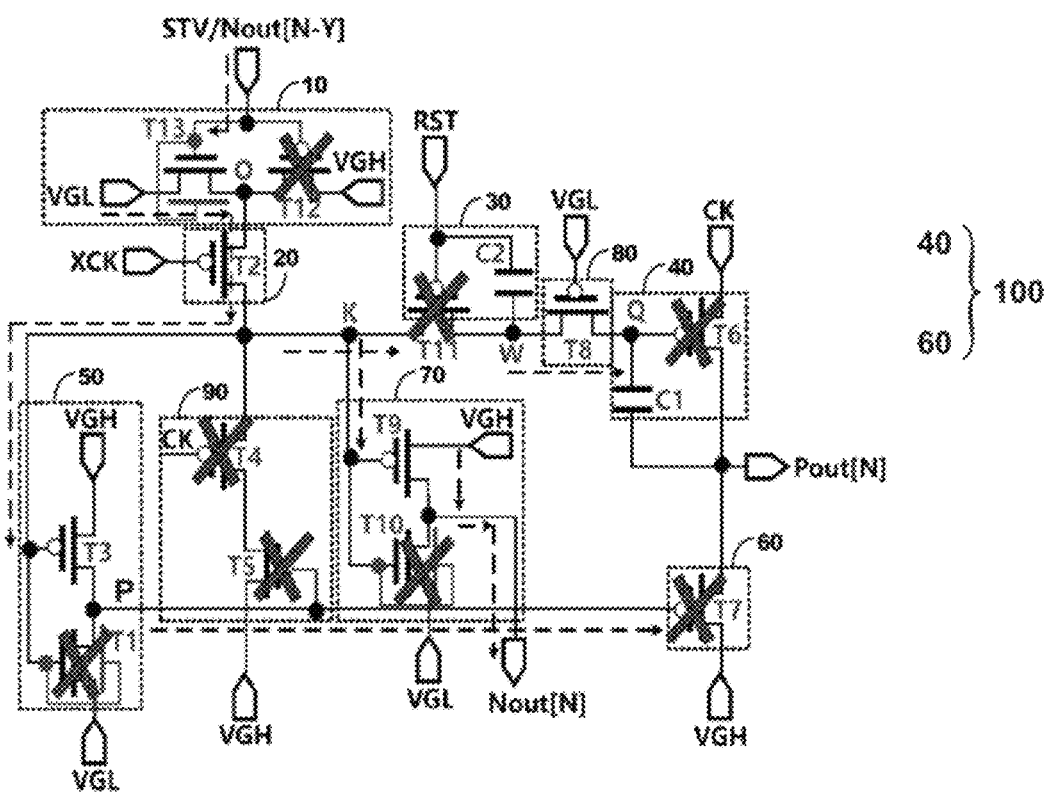
FIG. 10 is a schematic diagram of a state of the gate drive circuit shown in FIG. 3 in a sixth phase in FIG. 4.

In a sixth phase S6: as shown in FIGS. 4 and 10, the first clock signal XCK is at a low potential, the reset signal RST, the start control signal STV, and the second clock signal CK are all at a high potential, the second node K and the first node O are both at a low potential, the third node Q and the fourth node P are both at a high potential, the Nth stage of positive pulse scanning signal Nout[N] is at a high potential, and the Nth stage of negative pulse scanning signal Pout[N] is at a high potential.

Figure 11:
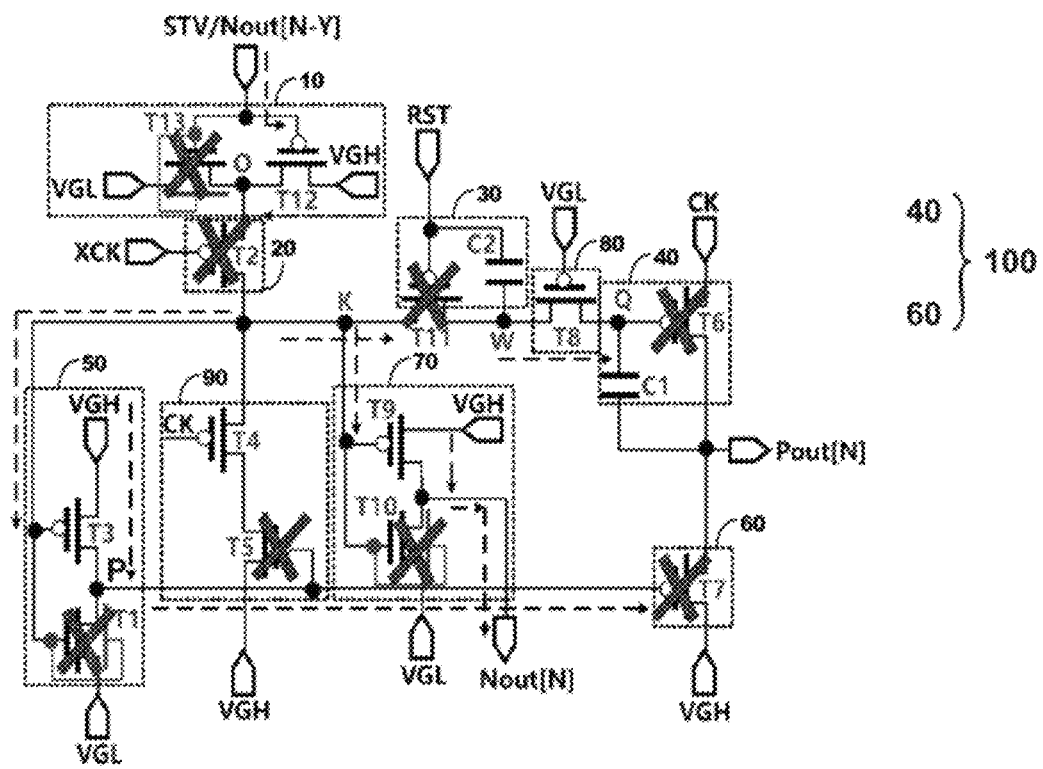
FIG. 11 is a schematic diagram of a state of the gate drive circuit shown in FIG. 3 in a seventh phase in FIG. 4.

In a seventh phase S7: as shown in FIGS. 4 and 11, the start control signal STV and the second clock signal CK are both at a low potential, the reset signal RST and the first clock signal XCK are both at a high potential, the second node K is at a low potential, the first node O, the third node Q and the fourth node P are all at a high potential, the Nth stage of positive pulse scanning signal Nout[N] is at a high potential, and the Nth stage of negative pulse scanning signal Pout[N] is at a high potential.

Figure 12:
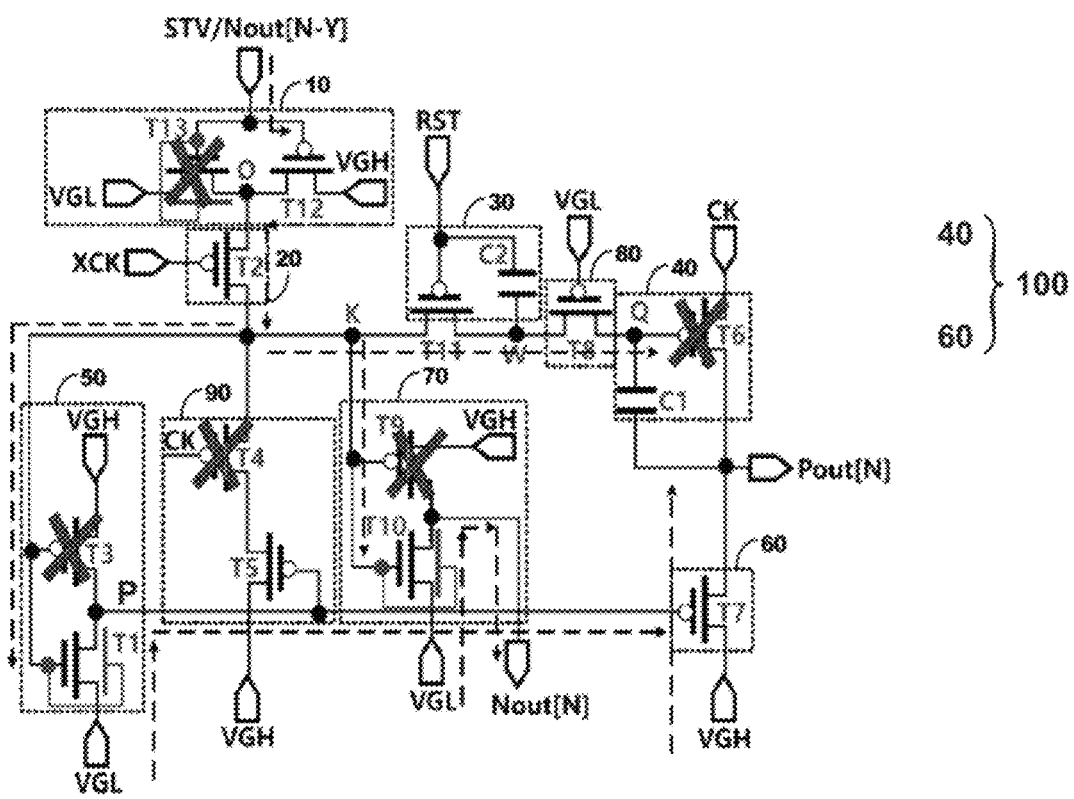
FIG. 12 is a schematic diagram of a state of the gate drive circuit shown in FIG. 3 in an eighth phase in FIG. 4.

In an eighth phase S8: as shown in FIGS. 4 and 12, the reset signal RST, the start control signal STV, and the first clock signal XCK are all at a low potential, the second clock signal CK is at a high potential, the fourth node P is at a low potential, the third node Q and the second node K are both at a high potential, the Nth stage of positive pulse scanning signal Nout[N] is at a low potential, and the Nth stage of negative pulse scanning signal Pout[N] is at a high potential.

Figure 13:
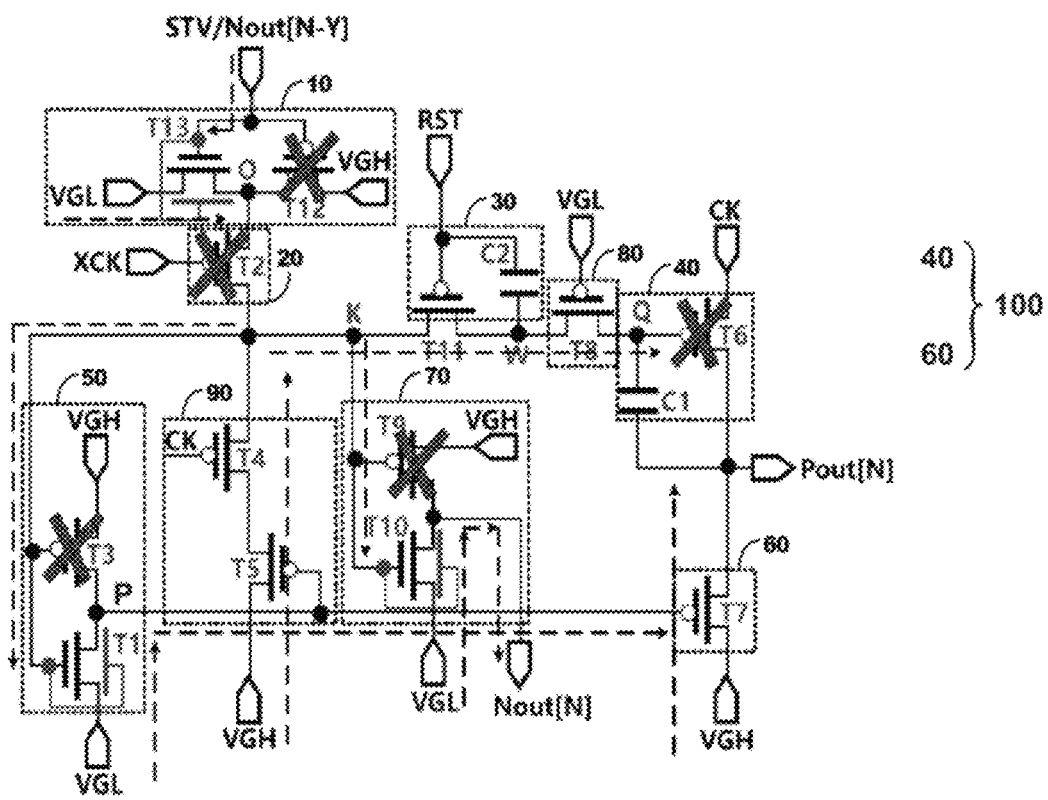
FIG. 13 is a schematic diagram of a state of the gate drive circuit shown in FIG. 3 in a ninth phase in FIG. 4.

In a ninth phase S9: as shown in FIGS. 4 and 13, the reset signal RST and the second clock signal CK are both at a low potential, the start control signal STV and the first clock signal XCK are both at a high potential, the first node O and the fourth node P are both at a low potential, the third node Q and the second node K are both at a high potential, the Nth stage of positive pulse scanning signal Nout[N] is at a low potential, and the Nth stage of negative pulse scanning signal Pout[N] is at a high potential.

Figure 14:
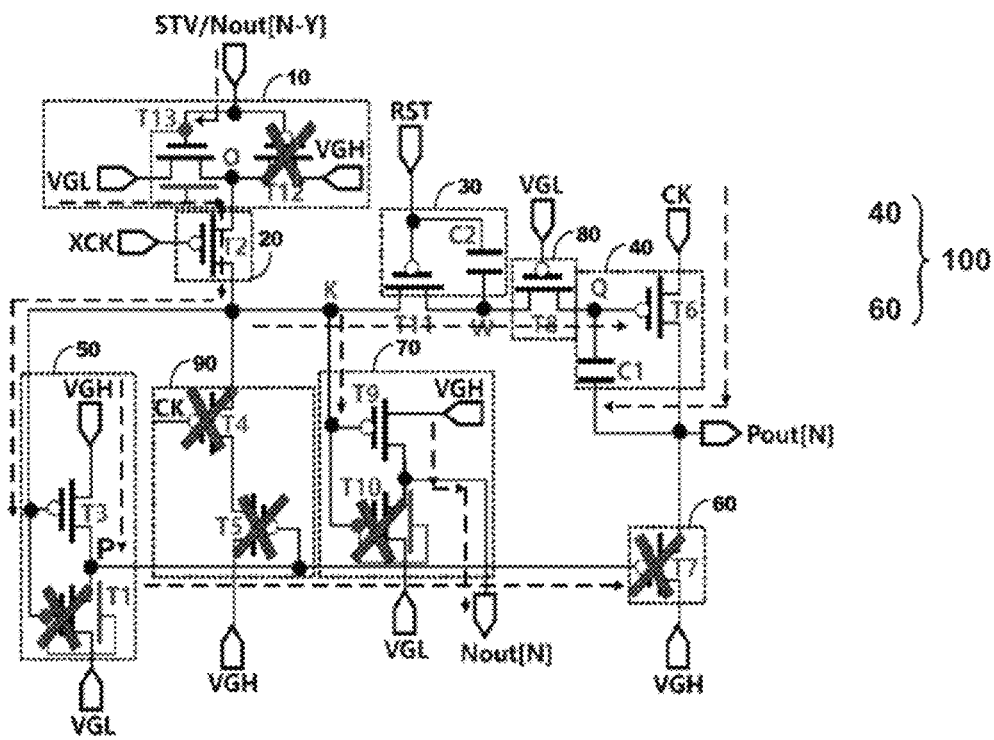
FIG. 14 is a schematic diagram of a state of the gate drive circuit shown in FIG. 3 in a tenth phase in FIG. 4.

In a tenth phase S10: as shown in FIGS. 4 and 14, the reset signal RST and the first clock signal XCK is at a low potential, the start control signal STV and the second clock signal CK are both at a high potential, the first node O, the third node Q, and the second node K are all at a low potential, the fourth node P is at a high potential, the Nth stage of positive pulse scanning signal Nout[N] is at a high potential, and the Nth stage of negative pulse scanning signal Pout[N] is at a high potential.

Figure 15:
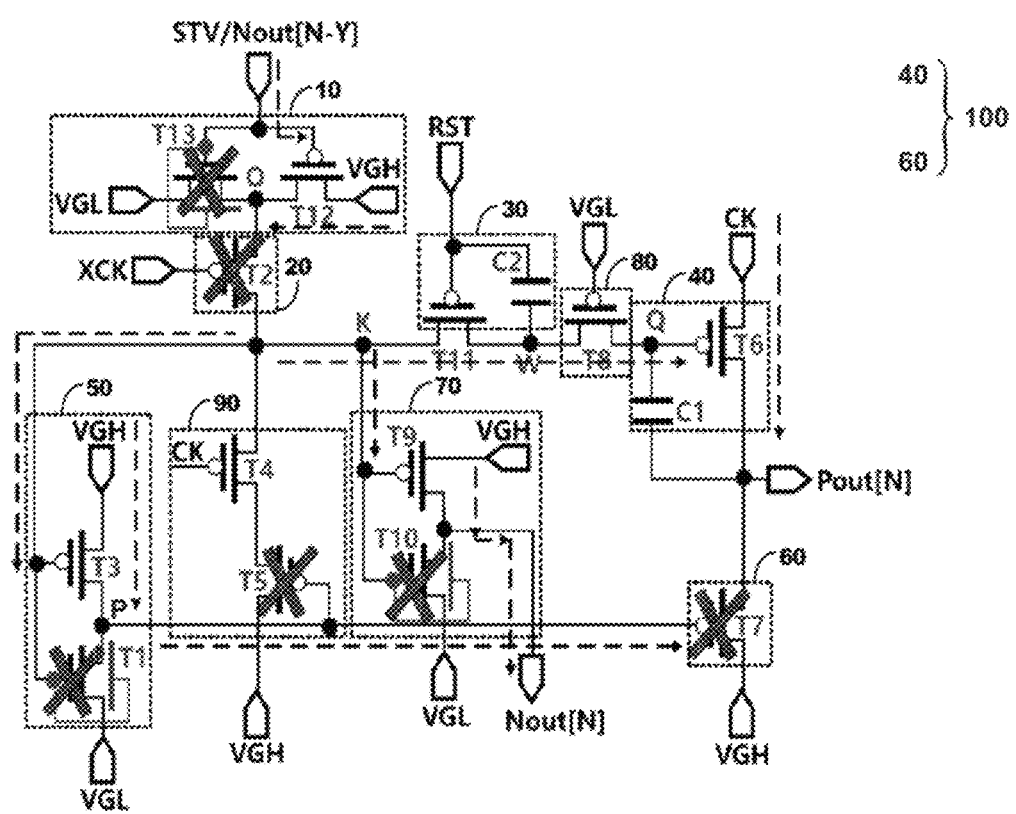
FIG. 15 is a schematic diagram of a state of the gate drive circuit shown in FIG. 3 in an eleventh phase in FIG. 4.

In an eleventh phase S11: as shown in FIGS. 4 and 15, the start control signal STV, the reset signal RST, and the second clock signal CK are both at a low potential, the first clock signal XCK are both at a high potential, the third node Q and the second node K are both at a low potential, the first node O and the fourth node P are both at a high potential, the Nth stage of positive pulse scanning signal Nout[N] is at a high potential, and the Nth stage of negative pulse scanning signal Pout[N] is at a low potential.

It should be noted that "a cross" in FIGS. 5 to 15 indicates that the transistor covered by the cross is in an off state, while the transistor that is not covered by the cross is in an on state. A dashed arrow in FIGS. 5 to 15 shows a current direction.

As can be seen from FIG. 4, the Nth stage of positive pulse scanning signal Nout[N] sequentially has a first positive pulse and a second positive pulse in a frame. The Nth stage of negative pulse scanning signal Pout[N] has a first negative pulse in the frame.

In the frame, a period of duration of the second positive pulse is longer than a period of duration of the first negative pulse, and the period of duration of the first negative pulse is within the period of duration of the second positive pulse.

Specifically, a falling edge of the second positive pulse is at the same time as a rising edge of the first negative pulse.

In an embodiment, a phase difference between a phase of the first clock signal XCK and a phase of the second clock signal CK is 180°; and each of a falling edge of the second clock signal CK, a falling edge of the second positive pulse, and a rising edge of the first negative pulse is within a period of duration of a positive pulse of the first clock signal XCK.

Figure 16:
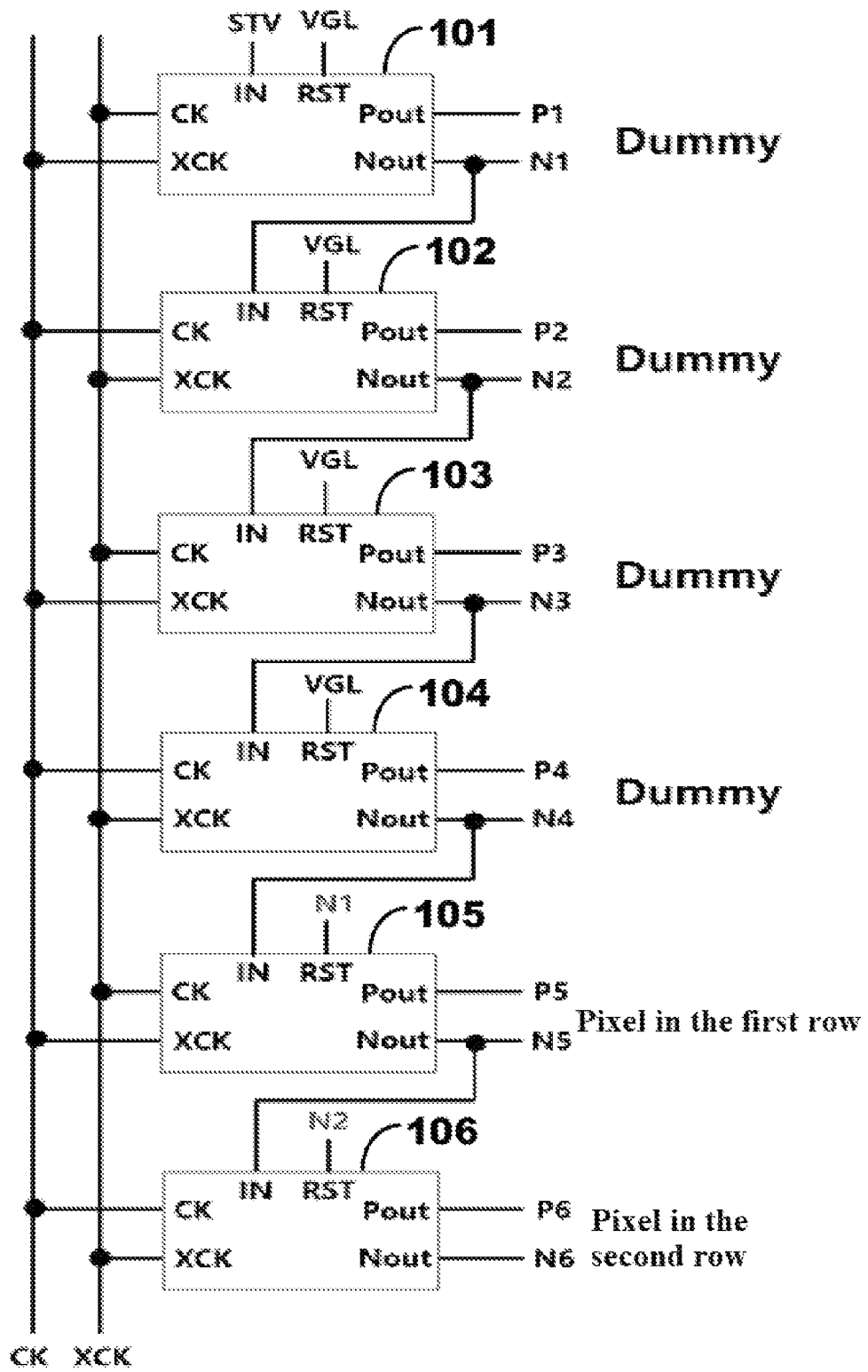
FIG. 16 is a schematic structural diagram of a cascaded connection between different gate drive units in the gate drive circuit shown in FIG. 3.

FIG. 16 is a schematic structural diagram of a cascaded connection between different gate drive units in the gate drive circuit shown in FIG. 3, in which a first gate drive unit 101, a second gate drive unit 102, a third gate drive unit 103, a fourth gate drive unit 104, a fifth gate drive unit 105, and a sixth gate drive unit or like are sequentially arranged from top to bottom. The first clock line is electrically connected to each of the gate drive units, and the second clock line is also electrically connected to each of the gate drive units.

P1-P6 may sequentially refer to a first stage of negative pulse scanning line for transmitting a first stage of negative pulse scanning signal, a second stage of negative pulse scanning line for transmitting a second stage of negative pulse scanning signal, a third stage of negative pulse scanning line for transmitting a third stage of negative pulse scanning signal, a fourth stage of negative pulse scanning line for transmitting a fourth stage of negative pulse scanning signal, a fifth stage of negative pulse scanning line for transmitting a fifth stage of negative pulse scanning signal, and a sixth stage of negative pulse scanning line for transmitting a sixth stage of negative pulse scanning signal, respectively. N1-N6 may sequentially refer to a first stage of positive pulse scanning line for transmitting a first stage of positive pulse scanning signal, a second stage of positive pulse scanning line for transmitting a second stage of positive pulse scanning signal, a third stage of positive pulse scanning line for transmitting a third stage of positive pulse scanning signal, a fourth stage of positive pulse scanning line for transmitting a fourth stage of positive pulse scanning signal, a fifth stage of positive pulse scanning line for transmitting a fifth stage of positive pulse scanning signal, and a sixth stage of positive pulse scanning line for transmitting a sixth stage of positive pulse scanning signal.

The stage transmission signal selection circuit 10 in the first gate drive unit 101 has an input terminal electrically connected to the start control line to receive the start control signal STV. The stage transmission signal selection circuit 10 in each of the other gate drive units has an input terminal connected to the positive pulse scanning line of the previous gate drive unit. For example, N1 is connected to the input terminal of the stage transmission signal selection circuit 10 in the second gate drive unit 102, N2 is connected to the input terminal of the stage transmission signal selection circuit 10 in the third gate drive unit 103, N3 is connected to the input terminal of the stage transmission signal selection circuit 10 in the fourth gate drive unit 104, N4 is connected to the input terminal of the stage transmission signal selection circuit 10 in the fifth gate drive unit 105, N5 is connected to the input terminal of the stage transmission signal selection circuit 10 in the sixth gate drive unit 106, and so on. Y may also be 2, 3, 4, 5, 6, or the like. An example in which Y is equal to 1 is taken herein.

The control terminal of the pulse number reduction circuit 30 in the fifth gate drive unit 105 is connected to N1, the control terminal of the pulse number reduction circuit 30 in the sixth gate drive unit 106 is connected to N2, and so on. X may also be 3, 4, 5, 6, 7, or the like. An example in which X is equal to 4 is taken herein.

Respective output terminal of each of the first gate drive unit 101 to the fourth gate drive unit 104 is not used to drive a corresponding pixel circuit for display, but is connected to a dummy pixel or suspended. Respective output terminal of the fifth gate drive unit 105 is electrically connected to a pixel circuit (Pixel) in the first row, and respective output terminal of the sixth gate drive unit 106 is electrically connected to a pixel circuit (Pixel) in the second row.

Figure 17:
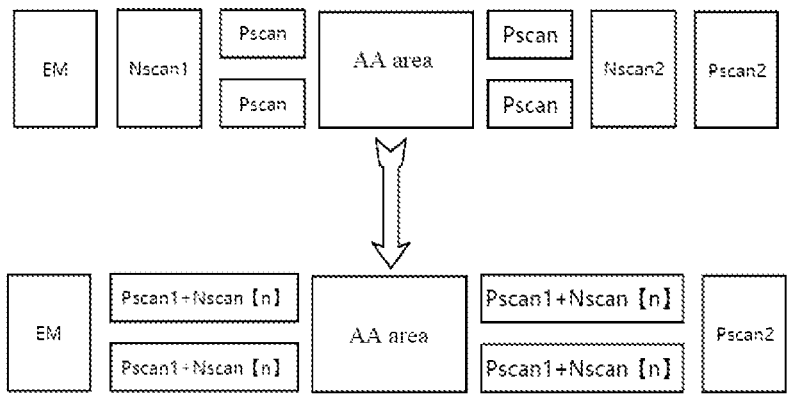
FIG. 17 is a schematic structural diagram of a display panel according to an embodiment of the present application.

An upper portion in FIG. 17 is a schematic structural diagram of a conventional display panel in which various gate drive circuits for providing a light emission control signal EM, a scanning signal Nscan1, and scanning signals Pscan are respectively arranged on the left side (which may be a non-display area or a frame area) of a display area (AA area), and various gate drive circuits for providing scanning signals Pscan, a scanning signal Nscan2, and a scanning signal Pscan2 are respectively arranged on the right side (which may be a non-display area or a frame area) of the display area (AA area).

Each of the scan signals Pscan may be used to drive a row of pixel circuits. The scanning signal Nscan1 and the scanning signal Nscan2 are operated in the same manner as the scanning signals Pscan, respectively, but one scanning signal Nscan1/Nscan2 needs to drive two rows of pixel circuits. In a practical operation, in order to realize a narrower frame, both the gate drive circuit for outputting the scanning signal Nscan1 and the gate drive circuit for outputting the scanning signal Nscan2 are set to be single-sided driving. However, this causes the driving capability of the two gate drive circuits to be deteriorated and the power consumption to be increased.

In view of this, in the embodiment, the gate drive circuit shown in FIG. 3 is provided as a double-sided drive circuit shown in a lower portion in FIG. 17. That is, the gate drive circuits shown in FIG. 3 are provided on both sides of a display area to input corresponding scanning signals from both ends of each of scanning lines at the same time. This not only improves the driving capability of the positive pulse scanning signal (Nscan), but also reduces the power consumption. Moreover, this also reduces the frame space, thereby facilitating the development of a narrower frame scheme.

An embodiment of the present application provides a display panel including a gate drive circuit described in at least one of the embodiments above and a pixel circuit, where a row of pixel circuits is electrically connected to an Nth stage of positive pulse scanning line and an Nth stage of negative pulse scanning line.

It should be understood that, since the display panel provided in the present embodiment includes the gate drive circuit in at least one of the above-described embodiments, it is also possible to output the second gate control signal with a greater number of pulses through the stage transmission signal selection circuit 10, the pull-up control circuit 20, and the second output stage 70, while the second gate control signal can also be selected as a stage transmission signal among different gate drive units. Moreover, the first gate control signal with a less number of pulses can be output by the stage transmission signal selection circuit 10, the pull-up control circuit 20, the pulse number reduction circuit 30, the first inversing circuit 50, and the first output stage 100, which can satisfy the need of the corresponding pixel circuit for the pulses of the gate control signal in the frame in terms of time, quality, or the like, thereby enabling the pixel circuit to be driven to realize picture quality display.

Figure 18:
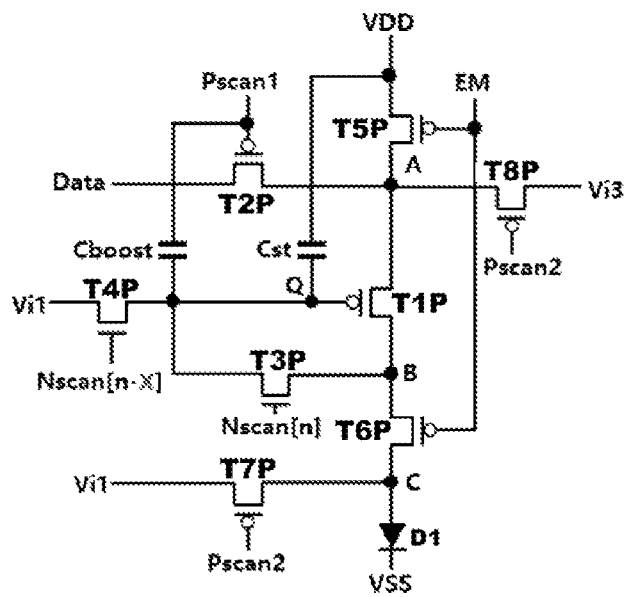
FIG. 18 is a schematic structural diagram of a pixel circuit in the display panel shown in FIG. 17.

FIG. 18 is a schematic structural diagram of a pixel circuit in the display panel shown in FIG. 17. It should be understood that the gate drive circuit shown in FIG. 3 may provide the pixel circuit shown in FIG. 18 with a corresponding scanning signal Nscan[n], a scanning signal Nscan[n–X], and a scanning signal Pscan1.

The pixel circuit shown in FIG. 18 may include at least one of a writing transistor T2P, a drive transistor T1P, a first light emission control transistor T5P, a second light emission control transistor T6P, a first initialization transistor T4P, a second initialization transistor T7P, a third initialization transistor T8P, a compensation transistor T3P, a light-emitting device D1, a storage capacitor Cst, and a bootstrap capacitor Cboost.

A first power supply line may be electrically connected to a first electrode of the first light emission control transistor T5P and one terminal of the storage capacitor Cst. A second electrode of the first light emission control transistor T5P may be electrically connected to a first electrode of the drive transistor T1P and a first electrode of the writing transistor T2P. A second electrode of the drive transistor T1P may be electrically connected to a first electrode of the compensation transistor T3P and a first electrode of the second light emission control transistor T6P. A second electrode of the second light emission control transistor T6P may be electrically connected to a first electrode of the second initialization transistor T7P and an anode of the light-emitting device D1, and a cathode of the light-emitting device D1 may be electrically connected to a second power supply line. A light emission control line may be electrically connected to a gate of the first light emission control transistor T5P and a gate of the second light emission control transistor T6P. A second electrode of the writing transistor T2P is electrically connected to a data line, and a gate of the writing transistor T2P is electrically connected to a first scanning line and one terminal of the bootstrap capacitor Cboost. A second electrode of the second initialization transistor T7P may be electrically connected to the second initialization line, and a gate of the second initialization transistor T7P may be electrically connected to a second scanning line. A second electrode of the compensation transistor T3P may be electrically connected to a gate of the drive transistor T1P, and a gate of the compensation transistor T3P may be electrically connected to a third scanning line. The gate of the drive transistor T1P may be electrically connected to another terminal of the storage capacitor Cst, another terminal of the bootstrap capacitor Cboost, and a first electrode of the first initialization transistor T4P. A second electrode of the first initialization transistor T4P may be electrically connected to a first initialization line, and a gate of the first initialization transistor T4P may be electrically connected to a fourth scanning line. A first electrode of the third initialization transistor T8P may be electrically connected to a first electrode of the drive transistor T1P, a second electrode of the third initialization transistor T8P may be electrically connected to a third initialization line, and a gate of the third initialization transistor T8P and a gate of the second initialization transistor T7P may share the second scanning line.

It should be noted that the second initialization line may be replaced with the first initialization line, so that a wiring required by the pixel circuit can be reduced, thereby facilitating the increasing density of the pixel circuit in the display panel.

The first electrode may be one of a source or a drain, and the second electrode may be the other of the source or the drain. For example, when the first electrode is the source, the second electrode is the drain. Alternatively, when the first electrode is the drain, the second electrode is the source.

The first power supply line may be used to transmit a positive power supply signal VDD and the second power supply line may be used to transmit a negative power supply signal VSS, where the potential of the positive power supply signal VDD is higher than the potential of the negative power supply signal VSS. The data line may be used to transmit a data signal Data. The light emission control line may be used for transmitting the light emission control signal EM. The first initialization line may be used to transmit a first initialization signal Vi1. The second initialization line may be used for transmitting a second initialization signal. The third initialization line may be used to transmit a third initialization signal Vi3. The first scanning line may be used to transmit the scanning signal Pscan1. The second scanning line may be used to transmit the scanning signal Pscan2. The third scanning line may be used to transmit the scanning signal Nscan[n]. The fourth scan line may be used to transmit the scanning signal Nscan[n–X].

Figure 19:
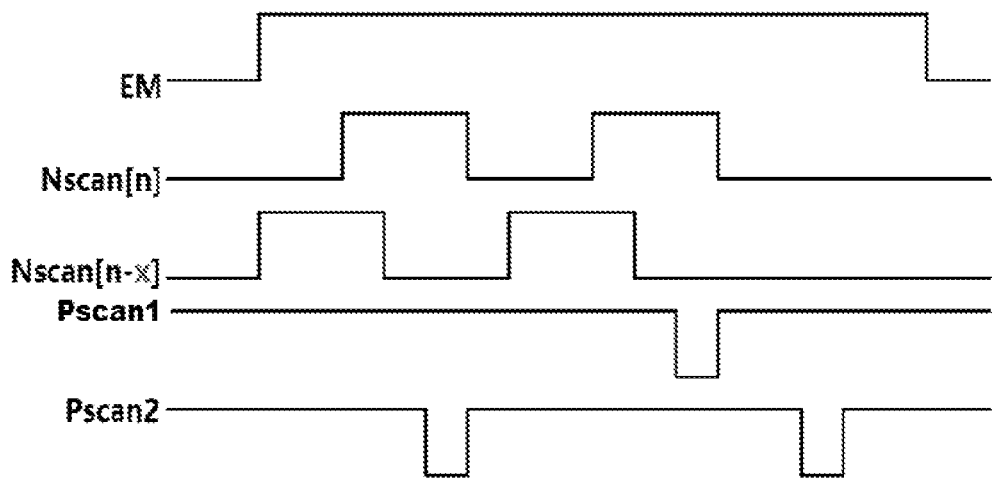
FIG. 19 is a schematic timing diagram of the pixel circuit shown in FIG. 18.

The operation timing of the pixel circuit shown in FIG. 18 in one frame is shown in FIG. 19. The pixel circuit shown in FIG. 18 can be normally displayed under the common driving of the scanning signal Pscan1, the scanning signal Pscan2, the scanning signal Nscan[n–X], the scanning signal Nscan[n], and the light emission control signal EM.

The scanning signal Pscan1, the scanning signal Nscan[n–X], and the scanning signal Nscan[n] may be provided by the gate drive circuit shown in FIG. 3. The scanning signal Pscan1 may be identical to the Nth stage of negative pulse scanning signal Pout[N], the scanning signal Nscan[n] may be identical to the Nth stage of positive pulse scanning signal Nout[N], and the scanning signal Nscan[n–X] may be identical to the (N–X)-th stage of positive pulse scanning signal Nout[N–X].

It can be understood that, for those ordinary skilled in the art, equivalent replacements or changes can be made according to the technical solutions and inventive concepts of the present disclosure, and all such changes or replacements should fall within the scope of the appended claims.

What is claimed is:

1. A gate drive circuit, comprising a plurality of cascaded gate drive units, wherein each of the gate drive units comprises:
   a stage transmission signal selection circuit electrically connected between a first wiring and a first node;
   a pull-up control circuit for controlling a potential of a second node based on a potential of the first node and a potential of a first clock signal;
   a pulse number reduction circuit electrically connected between the second node and a third node, the pulse number reduction circuit having a control terminal electrically connected to a reset line;
   a first inversion circuit connected between the second node and a fourth node;
   a first output stage for outputting a first gate control signal based on a potential of the third node and a potential of the fourth node; and
   a second output stage for outputting a second gate control signal based on the potential of the second node,
   wherein a number of pulses of the second gate control signal in one frame is greater than a number of pulses of the first gate control signal in one frame.

2. The gate drive circuit of claim 1, wherein the pulse number reduction circuit comprises a first transistor having a source, a drain and a gate, one of the source and the drain is electrically connected to the second node, another one of the source and the drain is electrically connected to the third node, and the gate is electrically connected to the reset line.

3. The gate drive circuit of claim 2, wherein a ratio of a width of a channel of the first transistor to a length of the channel is greater than or equal to 0.5 and less than or equal to 1.5.

4. The gate drive circuit of claim 2, wherein the pulse number reduction circuit further comprises a first capacitor, a terminal of the first capacitor is electrically connected to the gate of the first transistor, and another terminal of the first capacitor is electrically connected to the another one of the source and the drain.

5. The gate drive circuit of claim 4, wherein the first output stage comprises:
   a pull-up transistor, wherein a gate of the pull-up transistor is electrically connected to the third node, one of a source of the pull-up transistor and a drain of the pull-up transistor is electrically connected to a second clock line, and another one of the source of the pull-up transistor and the drain of the pull-up transistor is configured to output the first gate control signal; and
   a second capacitor, wherein a terminal of the second capacitor is electrically connected to the gate of the pull-up transistor, and another terminal of the second capacitor is electrically connected to the another one of the source of the pull-up transistor and the drain of the pull-up transistor,
   wherein a ratio of a capacity of the first capacitor to a capacity of the second capacitor is greater than or equal to 0.5.

6. The gate drive circuit of claim 1, wherein the stage transmission signal selection circuit comprises:
   a second transistor, wherein one of a source of the second transistor and a drain of the second transistor is electrically connected to a low potential line, another one of the source of the second transistor and the drain of the second transistor is electrically connected to the first node, a first gate of the second transistor is electrically connected to each of the first wiring and a second gate of the second transistor, and the second transistor is an N-channel type thin film transistor; and
   a third transistor, wherein one of a source of the third transistor and a drain of the third transistor is electrically connected to a high potential line, another one of the source of the third transistor and the drain of the third transistor is electrically connected to the first node, a gate of the third transistor is electrically connected to the first gate of the second transistor, and the third transistor is a P-channel type thin film transistor.

7. The gate drive circuit of claim 1, wherein the second output stage has an output terminal electrically connected to a second gate control line for transmitting the second gate control signal, the second gate control signal having a first positive pulse and a second positive pulse in sequence in one frame; and
   the first output stage has an output terminal electrically connected to a first gate control line for transmitting the first gate control signal, the first gate control signal having a first negative pulse in one frame.

8. The gate drive circuit of claim 7, wherein, in one frame, a period of duration of the second positive pulse is longer than a period of duration of the first negative pulse, and the period of duration of the first negative pulse is within the period of duration of the second positive pulse.

9. The gate drive circuit of claim 8, wherein the pull-up control circuit has a control terminal electrically connected to a first clock line for transmitting the first clock signal, the first output stage is electrically connected to a second clock line for transmitting a second clock signal, and a difference between a phase of the first clock signal and a phase of the second clock signal is 180°; and
   each of a falling edge of the second clock signal, a falling edge of the second positive pulse, and a rising edge of the first negative pulse is within a period of duration of a positive pulse of the first clock signal.

10. A display panel, comprising:
    a pixel circuit comprising a writing transistor for controlling inputting of a data signal and a compensation transistor for controlling inputting of the data signal to a gate of a drive transistor; and
    the gate drive circuit of claim 1, wherein the first output stage has an output terminal electrically connected to a gate of the writing transistor, and the second output stage has an output terminal electrically connected to a gate of the compensation transistor.

11. The display panel of claim 10, wherein the first gate control signal is an Nth stage negative pulse scanning signal, the second gate control signal is an Nth stage positive pulse scanning signal, and the control terminal of the pulse number reduction circuit is configured to receive an (N−X)-th stage positive pulse scanning signal, where N is an integer greater than or equal to 1 and X is an integer greater than or equal to 2.

12. The display panel of claim 11, wherein the pixel circuit further comprises a first initialization transistor for initializing a potential of the gate of the drive transistor, the first initialization transistor having a gate for receiving the (N−X)-th stage positive pulse scanning signal.

13. The display panel of claim 11, wherein the stage transmission signal selection circuit is configured to receive a start control signal or an (N−Y)-th stage positive pulse scanning signal, where Y is an integer greater than or equal to 1.

14. The display panel of claim 10, wherein the pulse number reduction circuit comprises a first transistor having a source, a drain and a gate, one of the source and the drain is electrically connected to the second node, another one of the source and the drain is electrically connected to the third node, and the gate is electrically connected to the reset line.

15. The display panel of claim 14, wherein a ratio of a width of a channel of the first transistor to a length of the channel is greater than or equal to 0.5 and less than or equal to 1.5.

16. The display panel of claim 14, wherein the pulse number reduction circuit further comprises a first capacitor, a terminal of the first capacitor is electrically connected to the gate of the first transistor, and another terminal of the first capacitor is electrically connected to the another one of the source and the drain.

17. The display panel of claim 16, wherein the first output stage comprises:
- a pull-up transistor, wherein a gate of the pull-up transistor is electrically connected to the third node, one of a source of the pull-up transistor and a drain of the pull-up transistor is electrically connected to a second clock line, and another one of the source of the pull-up transistor and the drain of the pull-up transistor is configured to output the first gate control signal; and
- a second capacitor, wherein a terminal of the second capacitor is electrically connected to the gate of the pull-up transistor, and another terminal of the second capacitor is electrically connected to the another one of the source of the pull-up transistor and the drain of the pull-up transistor,
- wherein a ratio of a capacity of the first capacitor to a capacity of the second capacitor is greater than or equal to 0.5.

18. The display panel of claim 10, wherein the stage transmission signal selection circuit comprises:

a second transistor, wherein one of a source of the second transistor and a drain of the second transistor is electrically connected to a low potential line, another one of the source of the second transistor and the drain of the second transistor is electrically connected to the first node, a first gate of the second transistor is electrically connected to each of the first wiring and a second gate of the second transistor, and the second transistor is an N-channel type thin film transistor; and a third transistor, wherein one of a source of the third transistor and a drain of the third transistor is electrically connected to a high potential line, another one of the source of the third transistor and the drain of the third transistor is electrically connected to the first node, a gate of the third transistor is electrically connected to the first gate of the second transistor, and the third transistor is a P-channel type thin film transistor.

19. The display panel of claim 10, wherein the second output stage has an output terminal electrically connected to a second gate control line for transmitting the second gate control signal, the second gate control signal having a first positive pulse and a second positive pulse in sequence in one frame; and
the first output stage has an output terminal electrically connected to a first gate control line for transmitting the first gate control signal, the first gate control signal having a first negative pulse in one frame.

20. The display panel of claim 19, wherein, in one frame, a period of duration of the second positive pulse is longer than a period of duration of the first negative pulse, and the period of duration of the first negative pulse is within the period of duration of the second positive pulse.

* * * * *